United States Patent

Nakamori

(10) Patent No.: US 10,574,225 B2
(45) Date of Patent: Feb. 25, 2020

(54) DRIVING CIRCUIT AND SEMICONDUCTOR MODULE

(71) Applicant: FUJI ELECTRIC CO., LTD., Kanagawa (JP)

(72) Inventor: Akira Nakamori, Matsumoto (JP)

(73) Assignee: FUJI ELECTRIC CO., LTD., Kanagawa (JP)

(*) Notice: Subject to any disclaimer, the term of this patent is extended or adjusted under 35 U.S.C. 154(b) by 439 days.

(21) Appl. No.: 15/442,717

(22) Filed: Feb. 27, 2017

(65) Prior Publication Data

US 2017/0170820 A1    Jun. 15, 2017

Related U.S. Application Data

(63) Continuation of application No. PCT/JP2016/050111, filed on Jan. 5, 2016.

(30) Foreign Application Priority Data

Mar. 9, 2015 (JP) .................................. 2015-045662

(51) Int. Cl.
*H03K 17/081*    (2006.01)
*H02H 9/02*    (2006.01)
(Continued)

(52) U.S. Cl.
CPC ......... *H03K 17/08116* (2013.01); *H02H 9/02* (2013.01); *H02M 1/08* (2013.01); *H02M 1/32* (2013.01); *H02M 7/5387* (2013.01)

(58) Field of Classification Search
USPC ............................................... 361/93.1, 93.9
See application file for complete search history.

(56) References Cited

U.S. PATENT DOCUMENTS 5,422,593 A  *  6/1995  Fujihira ................. G05F 1/573
                                            327/427
5,706,157 A  *  1/1998  Galecki .................. H04M 3/18
                                            361/111

(Continued)

FOREIGN PATENT DOCUMENTS

CN        101320939 A     12/2008
JP        2003-158868 A    5/2003
(Continued)

OTHER PUBLICATIONS

International Search Report for International Patent Application No. PCT/JP2016/050111, issued by the Japan Patent Office dated Mar. 29, 2016.

(Continued)

*Primary Examiner* — Scott Bauer

(57) ABSTRACT

Provided is a driving circuit for driving a switching element in accordance with an input signal. The driving circuit includes a driving unit connected to a control terminal of the switching element, where the driving unit is configured to switch, in accordance with the input signal, which one of a source current and a sink current is to be fed to the control terminal of the switching element, a first limiter configured to operate with a predetermined time constant and to limit a control voltage at the control terminal of the switching element to a first reference voltage when overcurrent is detected for a collector current of the switching element, and a second limiter configured to, when the overcurrent is detected, start lowering the control voltage earlier than an operation start timing of the first limiter that is determined by the time constant.

13 Claims, 11 Drawing Sheets

(51) Int. Cl.
*H02M 1/08* (2006.01)
*H02M 1/32* (2007.01)
*H02M 7/5387* (2007.01)

(56) References Cited

U.S. PATENT DOCUMENTS

| | | | | |
|---|---|---|---|---|
| 6,336,448 | B1* | 1/2002 | Furuhata | F02P 3/053 |
| | | | | 123/644 |
| 9,719,479 | B2* | 8/2017 | Ishii | F02P 3/0453 |
| 2001/0026429 | A1* | 10/2001 | Fukuda | H03K 17/0828 |
| | | | | 361/93.9 |
| 2008/0253155 | A1* | 10/2008 | Peng | H02M 1/32 |
| | | | | 363/50 |
| 2008/0304197 | A1 | 12/2008 | Higashi | |
| 2011/0317315 | A1* | 12/2011 | Motohashi | H02H 7/122 |
| | | | | 361/18 |
| 2012/0215431 | A1* | 8/2012 | Miyazawa | F02P 3/0552 |
| | | | | 701/115 |
| 2015/0372671 | A1 | 12/2015 | Akahane | |
| 2017/0201086 | A1* | 7/2017 | Chen | H02H 3/08 |
| 2018/0097514 | A1* | 4/2018 | Ishii | F02P 11/00 |
| 2019/0187190 | A1* | 6/2019 | Akahane | G01R 19/16571 |

FOREIGN PATENT DOCUMENTS

| | | |
|---|---|---|
| JP | 2005033611 A | 2/2005 |
| JP | 2007-208831 A | 8/2007 |
| JP | 2010-034701 A | 2/2010 |
| JP | 2010-62860 A | 3/2010 |
| JP | 2010-62934 A | 3/2010 |
| WO | 2014171278 A1 | 10/2014 |

OTHER PUBLICATIONS

Office Action issued for counterpart Chinese Application 201680002444.6, issued by the State Intellectual Property Office of People's Republic of China dated Jul. 15, 2019.

* cited by examiner

122

DRIVING CIRCUIT AND SEMICONDUCTOR MODULE

The contents of the following Japanese patent application(s) are incorporated herein by reference:
NO. 2015-045662 filed in JP on Mar. 9, 2015, and
NO. PCT/JP2016/050111 filed on Jan. 5, 2016.

BACKGROUND

1. Technical Field

The present invention relates to a driving circuit and a semiconductor module.

2. Related Art

In the conventional art, known driving circuits to drive switching elements such as IGBTs are capable of protecting the switching elements (see, for example, Japanese Patent Application Publication No. 2010-62860). Such circuits are configured to protect the IGBTs by limiting the voltage applied to the gate terminals of the IGBTs when overcurrent flows through the IGBTs.

The following documents are related.

PRIOR ART DOCUMENTS

Patent Documents

Patent Document 1: Japanese Patent Application Publication No. 2010-62860
Patent Document 2: Japanese Patent Application Publication No. 2010-62934
Patent Document 3: Japanese Patent Application Publication No. 2007-208831
Patent Document 4: Japanese Patent Application Publication No. 2003-158868

The driving circuit disclosed in Japanese Patent Application Publication No. 2010-62860 includes an operational amplifier configured to limit the voltage applied to an IGBT when overcurrent is detected in the IGBT. The driving circuit switches the state of the operational amplifier from the non-operational state to the operational state when overcurrent flows through the IGBT. With such a configuration, the operational amplifier does not affect the operation of the IGBT when the IGBT operates normally and can protect the IGBT when overcurrent is detected. However, the transition of the operational amplifier from the non-operational state to the operational state takes a time that is determined by the time constant of the operational amplifier. In other words, the conventional driving circuit has a delay between the detection of the overcurrent and the start of the protection of the IGBT. This means that efforts can be made to start the protecting operation even earlier.

SUMMARY

A first aspect of the innovations herein provides a driving circuit for driving a switching element in accordance with an input signal. The driving circuit may include a driving unit connected to a control terminal of the switching element. The driving unit may be configured to switch, in accordance with the input signal, which one of a source current and a sink current is to be fed to the control terminal of the switching element. The driving circuit may include a first limiter configured to operate with a predetermined time constant and to limit a control voltage at the control terminal of the switching element to a first reference voltage when overcurrent is detected for a collector current of the switching element. The driving circuit may include a second limiter configured to, when the overcurrent is detected, start lowering the control voltage earlier than an operation start timing of the first limiter that is determined by the time constant.

The first reference voltage may be higher than a threshold voltage of the switching element. The second limiter may lower the control voltage to a second reference voltage that is higher than the first reference voltage, when the overcurrent is detected.

The second limiter may include a limitation transistor configured to switch whether to connect the control terminal of the switching element to a reference potential. When the overcurrent is detected, the limitation transistor may connect the control terminal of the switching element to the reference potential before the first limiter starts limiting the control voltage.

The first limiter may include an operational amplifier that is configured to operate with the time constant, has an output terminal connected to the control terminal of the switching element and is configured to regulate the control voltage based on a difference between the control voltage and the first reference voltage. When the overcurrent is detected, the second limiter may control the limitation transistor to connect the control terminal of the switching element to the reference potential before the operational amplifier starts limiting the control voltage.

The second limiter may include a control voltage comparator configured to compare the control voltage and the second reference voltage and output a result of the comparison. The second limiter may include a control circuit configured to control the limitation transistor to connect the control terminal of the switching element to the reference potential when the overcurrent is detected and the control voltage is higher than the second reference voltage.

The second limiter may include a control circuit configured to control the limitation transistor to connect the control terminal of the switching element to the reference potential until a predetermined period elapses after the overcurrent is detected.

The driving unit may include a sink-side transistor configured to draw the sink current from the control terminal of the switching element. The limitation transistor may have a lower current drawing capability than the sink-side transistor.

When the overcurrent is detected, the second limiter may keep the time constant of the first limiter reduced until the control voltage reaches the second reference voltage. The first limiter may include an operational amplifier that is configured to operate with the time constant, has an output terminal connected to the control terminal of the switching element and is configured to regulate the control voltage based on a difference between the control voltage and the first reference voltage. The second limiter may include a control voltage comparator configured to compare the control voltage and the second reference voltage and outputs a result of the comparison. The second limiter may include a control circuit configured to reduce the time constant of the operational amplifier when the overcurrent is detected and the control voltage is higher than the second reference voltage.

The first limiter may include an operational amplifier that is configured to operate with the time constant, has an output terminal connected to the control terminal of the switching element and is configured to regulate the control voltage based on a difference between the control voltage and the first reference voltage. The second limiter may include a control circuit configured to keep the time constant of the operational amplifier reduced until a predetermined period elapses after the overcurrent is detected.

The operational amplifier may include a differential circuit configured to operate according to a difference between the control voltage and the first reference voltage. The operational amplifier may include a time constant circuit positioned between an output end of the differential circuit and an output end of the operational amplifier. The operational amplifier may include a short switching unit configured to switch whether to short ends of the time constant circuit. The control circuit may instruct the short switching unit to short the ends of the time constant circuit when the overcurrent is detected and the control voltage is higher than the second reference voltage.

The operational amplifier may transition from a non-operational state to an operational state when the overcurrent is detected. The driving unit may include a source-side transistor configured to feed the source current to the control terminal of the switching element. The driving circuit may further comprise a circuit configured to turn off the source-side transistor when the overcurrent is detected.

A second aspect of the innovations herein provides a semiconductor module including the driving circuit relating to the first aspect and a semiconductor circuit including a switching element.

The summary clause does not necessarily describe all necessary features of the embodiments of the present invention. The present invention may also be a sub-combination of the features described above.

EXEMPLARY EMBODIMENTS OF THE INVENTION

Hereinafter, some embodiments of the present invention will be described. The embodiments do not limit the invention according to the claims, and all the combinations of the features described in the embodiments are not necessarily essential to means provided by aspects of the invention.

Figure 1:
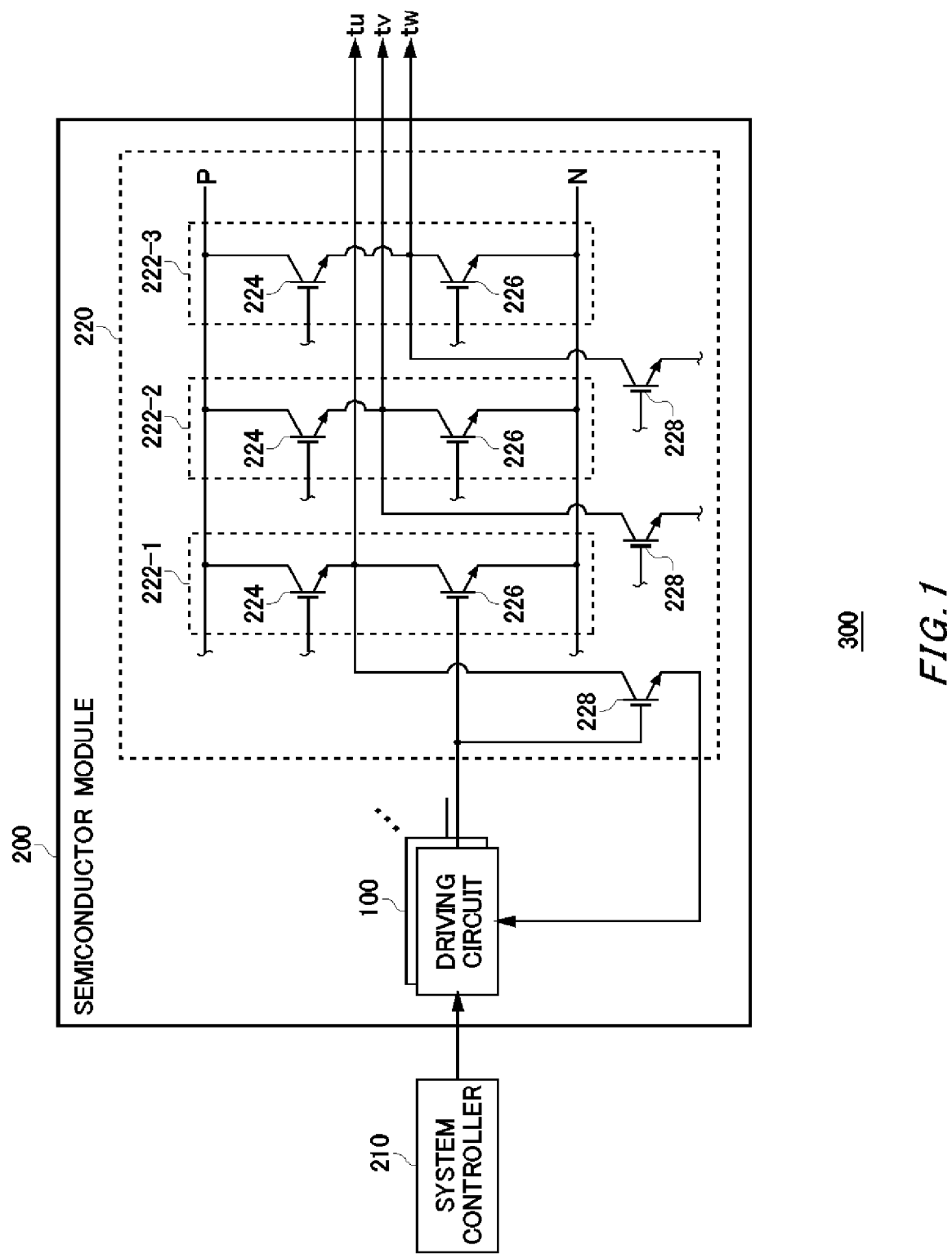
FIG. 1 schematically shows a system 300 relating to one embodiment of the present invention.

FIG. 1 schematically shows a system 300 relating to one embodiment of the present invention. The system 300 uses a switching element such as an IGBT to output a predetermined signal. In the present example, the system 300 outputs a three-phase AC signal (tu, tv, tw) used to drive a load such as a three-phase AC motor. The system 300 includes a system controller 210 and a semiconductor module 200.

The system controller 210 outputs a control signal to control the semiconductor module 200. In the present example, the system controller 210 generates a control signal to cause the semiconductor module 200 to output a three-phase AC signal. The system controller 210 includes a computing apparatus such as a CPU.

The semiconductor module 200 includes one or more driving circuits 100 and a semiconductor circuit 220. The semiconductor circuit 220 operates in accordance with driving signals from the driving circuits 100 to output a predetermined signal (in the present example, a three-phase AC signal tu, tv, tw). The semiconductor circuit 220 includes one or more switching elements. In the present example, the semiconductor circuit 220 is an inverter circuit including first to third switching arms 222-1 to 222-3. The first to third switching arms 222-1 to 222-3 are collectively referred to as the switching arms 222. The switching arms 222 each include two switching elements. In addition, the semiconductor circuit 220 relating to the present example further includes current detector elements 228 provided for the switching arms 222 in a one-to-one correspondence.

The first to third switching arms 222-1 to 222-3 are arranged in parallel with each other between a positive-side line P and a negative-side line N. A predetermined DC voltage is applied between the positive-side line P and the negative-side line N. For example, the negative-side line N is grounded. The switching arms 222 each include an upper switching element 224 and a lower switching element 226 that are connected in series between the positive-side line P and the negative-side line N.

In the present example, the semiconductor circuit 220 outputs an output signal having a high voltage determined according to the voltage between the positive-side line P and the negative-side line N. For example, the voltage between the positive-side line P and the negative-side line N is approximately several hundred volts to several thousand volts.

Each switching arm 222 outputs, as the output signal, the voltage at the connection point between the upper switching element 224 and the lower switching element 226. Each switching element is, for example, a transistor having a high breakdown voltage, such as an IGBT.

The driving circuits 100 are configured to, in accordance with the input signal input from the system controller 210, drive the switching elements included in the semiconductor module 200. In the present example, the driving circuits 100 are provided for the switching elements included in the switching arms 222 in a one-to-one correspondence. The respective driving circuits 100 are formed in different ICs. Alternatively, more than one driving circuit 100 may be formed in a single IC. Each driving circuit 100 is configured to control a corresponding switching element so that a three-phase AC signal tu, tv and tw is generated.

In the example shown in FIG. 1, three switching arms 222 each including two switching elements are provided. Therefore, there are six switching elements. Accordingly, six driving circuits 100 are provided. Each driving circuit 100 applies a control voltage (in the present example, a gate voltage) to the control terminal of the corresponding switching element (in the present example, the gate terminal of the IGBT). The respective driving circuits 100 control the corresponding switching elements in such a manner that the upper switching element 224 and the lower switching element 226 included in the same switching arm 222 are not turned on simultaneously.

For example, while the lower switching element 226 in the switching arm 222 is turned on, the upper switching element 224 is turned off. If the collector and the emitter of the upper switching element 224 are shorted for some reason (what is called, an arm-short circuit occurs), the high voltage between the positive-side line P and the negative-side line N is directly applied between the collector and the emitter of the lower switching element 226. This causes excessive currents to flow through the switching arm 222.

Each current detector element 228 draws part of the currents flowing through the corresponding switching arm 222. The current detector elements 228 are, for example, power semiconductor devices such as IGBTs. Each current detector element 228 is arranged in parallel with the lower switching element 226 of the corresponding switching arm 222. Here, the driving circuit 100 that is designed to drive the lower switching element 226 controls the current detector element 228 in synchronization with the control of the lower switching element 226.

Here, the device size of the current detector element 228 is sufficiently smaller than the device size of the lower switching element 226. Therefore, the currents flowing through the current detector element 228 are sufficiently smaller than the currents flowing through the lower switching element 226. For example, the device size of the current detector element 228 is approximately 1/10,000 of the device size of the lower switching element 226, and the currents flowing through the current detector element 228 are approximately 1/10,000 of the currents flowing through the lower switching element 226. Here, the term "device size" indicates the area occupied by the element.

With such a configuration, the current detector element 228 can draw currents proportional to the currents flowing through the lower switching element 226. In addition, since the currents drawn into the current detector element 228 are much smaller than the currents flowing through the lower switching element 226, the current draw hardly affect the currents flowing through the lower switching element 226. The currents drawn into the current detector element 228 may be equal to or lower than 1/100, 1/1000 or 1/10,000 of the currents flowing through the corresponding switching element 226.

The driving circuit 100 that is configured to drive the lower switching element 226 detects whether overcurrent flows through the corresponding switching element 226 based on the currents drawn into the corresponding current detector element 228. When detecting that overcurrent flows through the corresponding switching element 226, the driving circuit 100 limits the control voltage applied to the control terminal of the corresponding switching element 226. In this way, the driving circuit 100 can limit the currents flowing through the corresponding switching element 226 and resultantly protect the switching element 226.

Figure 2:
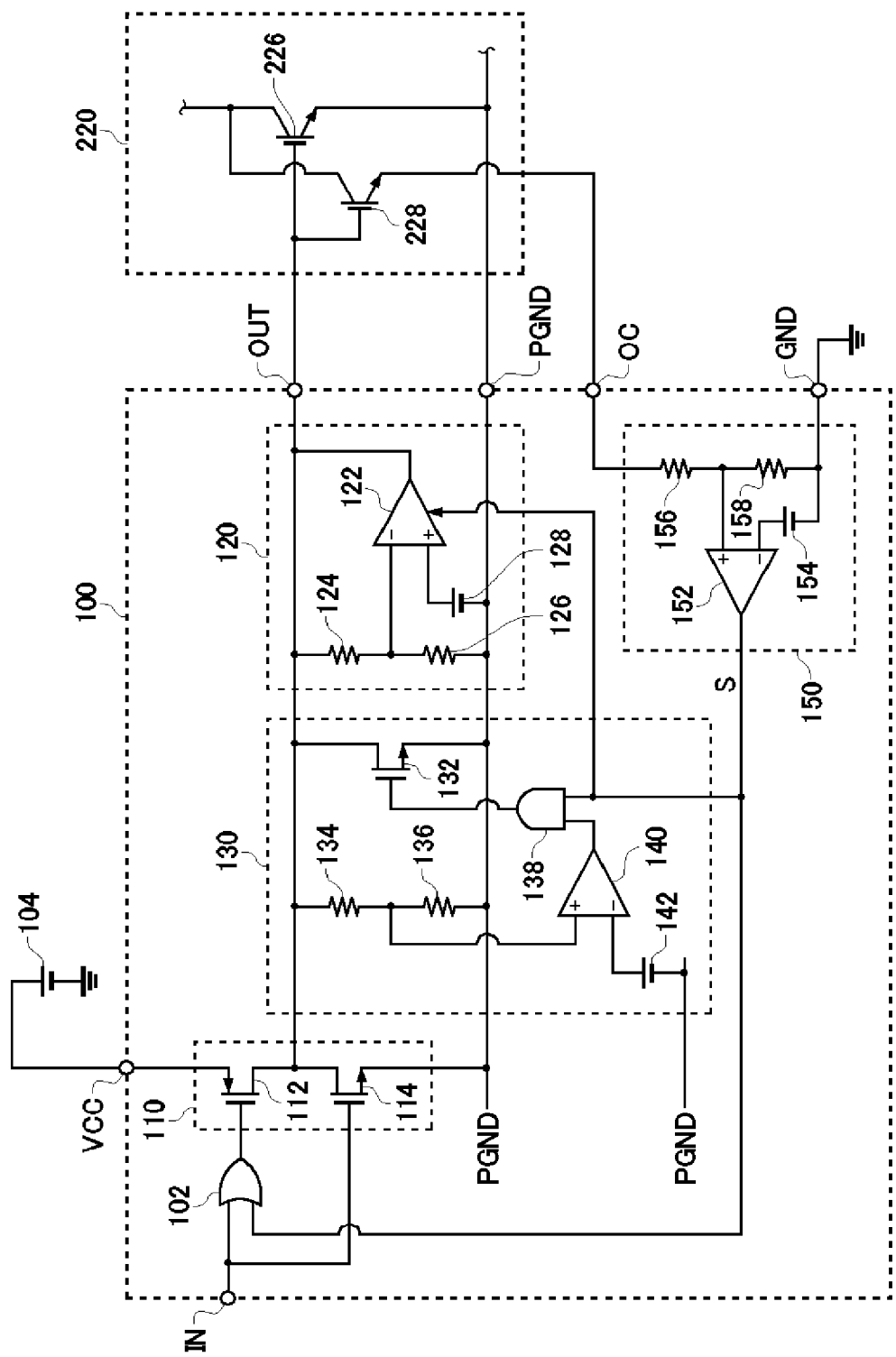
FIG. 2 is a circuit diagram showing a driving circuit 100 relating to a first embodiment, together with a semiconductor circuit 220.

FIG. 2 is a circuit diagram showing a driving circuit 100 relating to a first embodiment, together with the semiconductor circuit 220. FIG. 2 shows the driving circuit 100 that is designed to drive the lower switching element 226. The driving circuit 100 receives at an IN terminal thereof the input signal from the system controller 210 shown in FIG. 1. The driving circuit 100 drives the switching element 226 in accordance with the input signal.

According to the present example, under normal circumstances where no overcurrent is detected, the driving circuit 100 turns on the switching element 226 when the input signal indicates the L level (the low level). Under the normal circumstances, the driving circuit 100 turns off the switching element 226 when the input signal indicates the H level (the high level). The voltage value of the input signal indicating the H level is equal to the voltage at a VCC terminal, which will be described later. The voltage value of the input signal indicating the L level is equal to a reference potential PGND, which will be described later.

The driving circuit 100 of the present example includes, a driving unit 110, a first limiter 120, a second limiter 130, an overcurrent detector 150 and an OR circuit 102. The following first describes the driving circuit 100 briefly. The driving unit 110 operates in accordance with the input signal and outputs the control voltage OUT designed to control the switching element 226. The overcurrent detector 150 monitors whether overcurrent flows through the switching element 226.

The first limiter 120 limits the control voltage OUT applied to the control terminal of the switching element 226 to a first reference voltage when the overcurrent detector 150 detects the overcurrent. Under the normal circumstances where no overcurrent is detected, the first reference voltage is lower than the control voltage OUT applied to turn on the switching element 226. It, however, should be noted that the first reference voltage is preferably higher than the threshold voltage for the gate voltage to cause the switching element 226 to operate (hereinafter, simply referred to as "the threshold voltage of the switching element 226").

For example, it may not be preferable for industrial IGBTs to suddenly cut off the currents even if overcurrent occurs. According to the present example, when overcurrent is detected, the first limiter 120 limits the currents flowing through the switching element 226 while still keeping the switching element 226 turned on.

In addition, the first reference voltage is preferably higher than the threshold voltage of the current detector element 228. A too low first reference voltage makes it difficult for currents to flow through the current detector element 228, which compromises the accuracy of the overcurrent detection.

Here, the first limiter 120 operates with a predetermined time constant, in other words, with a predetermined time delay due to the factors such as the presence of a phase compensation circuit in an amplifier included in the first limiter 120. The time constant of the first limiter 120 may be determined in such a manner that the overshoot and undershoot of the control voltage OUT fall within a predetermined range. This predetermined range for the control voltage OUT is preferably set in such a manner that the switching element 226 may be prevented from breaking down.

With the above-described configuration, the first limiter 120 can appropriately control the control voltage OUT applied to the control terminal of the switching element 226. However, the first limiter 120 has a delay determined by the above-described time constant until the first limiter 120 starts limiting the control voltage OUT after the overcurrent detector 150 detects overcurrent.

The second limiter 130 is configured to start lowering the control voltage OUT at a timing earlier than the operation start timing at which the first limiter 120 starts limiting the voltage, when the overcurrent detector 150 detects overcurrent. The second limiter 130 continues lowering the control voltage OUT until the control voltage OUT and the like satisfy predetermined conditions. The second limiter 130 preferably stops limiting the control voltage OUT after the first limiter 120 starts limiting the control voltage OUT. With such a configuration, when overcurrent is detected, the control voltage OUT applied to the switching element 226 can be limited in a swift and appropriate manner.

Next, the following describes an exemplary circuit structure of the driving circuit 100 in detail. The VCC terminal of the driving circuit 100 is connected to a predetermined DC power source 104. The DC power source 104 generates a DC voltage that is just enough to allow the driving unit 110 to drive the switching element 226. According to the present example, the DC power source 104 generates a DC voltage of 15 V and applies the generated voltage to the VCC terminal.

The OUT terminal applies the voltage and current output from the driving unit 110 to the connection terminal of the switching element 226 and the connection terminal of the current detector element 228. In the present example, the switching element 226 and the current detector element 228 are IGBTs, and the OUT terminal is connected to the gate terminals of the IGBTs.

A PGND terminal is connected to the negative-side line N of the semiconductor circuit 220. An OC terminal receives the currents drawn into the current detector element 228 and inputs the received currents into the overcurrent detector 150. A GND terminal is connected to the ground potential.

The OR circuit 102 outputs a logical sum between the input signal and a detection signal S output from the overcurrent detector 150. In the present example, the detection signal S indicates the H level when overcurrent flows through the switching element 226 and the L level under the normal circumstances where no overcurrent is detected.

The driving unit 110 is connected to the control terminal of the switching element 226 via the OUT terminal. While operating normally, the driving unit 110 switches which one of the source current and the sink current is fed to the control terminal of the switching element 226, in accordance with the input signal input into the IN terminal. Here, the source current represents the current supplying positive charges from the driving unit 110 to the control terminal of the switching element 226, and the sink current represents the current drawing positive charges from the control terminal of the switching element 226 into the driving unit 110.

By operating in the above-described manner, the driving unit 110 controls the voltage at the control terminal of the switching element 226. It should be noted that the driving unit 110 controls the voltage at the control terminal of the current detector element 228 to be equal to the voltage at the control terminal of the switching element 226. In this way, the current detector element 228 can operate in synchronization with the switching element 226.

In the present example, the driving unit 110 includes a source-side transistor 112 and a sink-side transistor 114. The source-side transistor 112 has a source that is connected to the VCC terminal and has a drain that is connected to the drain of the sink-side transistor 114. The sink-side transistor 114 has a source that is connected to the reference potential PGND. The connection point between the source-side transistor 112 and the sink-side transistor 114 is connected to the control terminal of the switching element 226 via the OUT terminal.

In the present example, the source-side transistor 112 is a P-channel transistor and the sink-side transistor 114 is an N-channel transistor. The gate terminal of the source-side transistor 112 is connected to the output terminal of the OR circuit 102. The gate terminal of the sink-side transistor 114 is connected to the IN terminal.

Under the normal circumstances, when the input signal indicates the L level, the source-side transistor 112 is turned on and the sink-side transistor 114 is turned off. As a result, the VCC terminal is connected to the control terminal of the switching element 226 via the source-side transistor 112. In this case, the DC power source 104 applies a predetermined DC voltage and a source current to the control terminal of the switching element 226.

When the input signal indicates the H level, the source-side transistor 112 is turned off and the sink-side transistor 114 is turned on. As a result, the PGND potential is connected to the control terminal of the switching element 226 via the sink-side transistor 114. In this case, the sink-side transistor 114 draws the sink current from the control terminal of the switching element 226.

The overcurrent detector 150 detects whether the collector current of the switching element 226 reaches an overcurrent level. In the present example, the overcurrent detector 150 detects whether the currents drawn into the OC terminal via the current detector element 228 exceed a predetermined threshold.

In the present example, the overcurrent detector 150 includes resistances 156 and 158, a threshold power source 154, and a current comparator 152. The resistances 156 and 158 are connected in series between the OC terminal and the GND terminal. The voltage at the connection point between the resistance 156 and the resistance 158 is determined by the current drawn into the OC terminal and the resistance value of the resistance 158.

The current comparator 152 compares the voltage at the connection point between the resistance 156 and the resistance 158 against the voltage generated by the threshold power source 154. In other words, the overcurrent detector 150 converts, into a voltage, the current that is proportional to the current flowing through the switching element 226 and compares the resulting voltage against the reference voltage provided by the threshold power source 154. The current comparator 152 outputs a detection signal S that indicates the H level when the voltage at the connection point between the resistance 156 and the resistance 158 is higher than the reference voltage and that indicates the L level when the voltage at the connection point between the resistance 156 and the resistance 158 is equal to or lower than the reference voltage. The voltage generated by the threshold power source 154 is set according to the current value based on which an overcurrent is detected.

When the overcurrent detector 150 outputs a detection signal S indicating the H level, the OR circuit 102 outputs the H level irrespective of the logic value of the input signal. Accordingly, the source-side transistor 112 is turned off, and the control terminal of the switching element 226 is disconnected from the VCC terminal. Here, overcurrent is detected while the switching element 226 is turned on. For this reason, the sink-side transistor 114 is assumed to be turned off. Here, the driving circuit 100 may further include a circuit designed to force the sink-side transistor 114 to be turned off when overcurrent is detected.

In addition, the first limiter 120 and the second limiter 130 also operate in accordance with the detection signal S. When receiving a detection signal S indicating the H level, the first limiter 120 limits the control voltage OUT applied to the control terminal of the switching element 226 to the first reference voltage. In the present example, the first limiter 120 includes an operational amplifier 122, resistances 124 and 126 for voltage division, and a first reference power source 128. One of the ends of the resistance 124 is connected to one of the ends of the resistance 126. The other end of the resistance 124 is connected to the OUT terminal. The other end of the resistance 126 is connected to the PGND. The connection point between the resistance 124 and the resistance 126 is connected to the inverse input terminal of the operational amplifier 122. The positive-side terminal of the first reference power source 128 is connected to the non-inverse input terminal of the operational amplifier 122, and the negative-side terminal of the first reference power source 128 is connected to the PGND. The output from the operational amplifier 122 is connected to the OUT terminal. In FIG. 2, the signal input from below into the operational amplifier 122, which is indicated by an arrow, is designed to control the operational amplifier 122 to operate or not to operate.

The operational amplifier 122 outputs a voltage determined based on the difference between the control voltage OUT applied to the control terminal of the switching element 226 and the first reference voltage. In the present example, the operational amplifier 122 compares the control voltage OUT divided by the resistances 124 and 126 against the voltage generated by the first reference power source 128. The voltage generated by the first reference power source 128 is set based on the resistance ratio between the resistance 124 and the resistance 126 and on the first reference voltage, which is to be compared against the control voltage OUT. Here, the combined resistance value of the resistances 124 and 126 is high enough to prevent the current flowing through the resistances 124 and 126 from affecting the operation of the switching element 226.

The output terminal of the operational amplifier 122 is connected to the control terminal of the switching element 226 via the OUT terminal. In this way, the operational amplifier 122 operates to control the control voltage OUT of the switching element 226 to be equal to the first reference voltage. It should be noted that the operational amplifier 122 operates with a predetermined time constant, in other words, with a predetermined time delay.

Here, the operational amplifier 122 does not operate while no overcurrent is detected. The operational amplifier 122 transitions from the non-operational state to the operational state when receiving a detection signal S indicating the H level. As described above, the operational amplifier 122 has a delay determined by the intrinsic time constant until the operational amplifier 122 starts outputting the voltage based on the difference between the control voltage OUT and the first reference voltage after the operational amplifier 122 receives the detection signal S indicating the H level.

When receiving the detection signal S indicating the H level, the second limiter 130 starts lowering the control voltage OUT of the switching element 226 earlier than the first limiter 120 starts operating. In the present example, the second limiter 130 includes a limitation transistor 132, resistances 134 and 136 for voltage division, a control voltage comparator 140, a second reference power source 142, and an AND circuit 138. One of the ends of the resistance 134 is connected to one of the ends of the resistance 136, and the other end of the resistance 134 is connected to the OUT terminal and the other end of the resistance 136 is connected to the PGND. The connection point between the resistance 134 and the resistance 136 is connected to the non-inverse input terminal of the control voltage comparator 140.

The positive-side electrode of the second reference power source 142 is connected to the inverse input terminal of the control voltage comparator 140, and the negative-side electrode of the second reference power source 142 is connected to the PGND. The output terminal of the control voltage comparator 140 is connected to one of the input terminals of the AND circuit 138. The detection signal S is input into the other input terminal of the AND circuit 138. The output terminal of the AND circuit 138 is connected to the gate terminal of the limitation transistor 132. The drain terminal of the limitation transistor 132 is connected to the OUT terminal, and the source terminal of the limitation transistor 132 is connected to the PGND. The AND circuit 138 is an exemplary control circuit designed to control the limitation transistor 132.

The limitation transistor 132 switches whether the control terminal of the switching element 226 is to be connected to the reference potential PGND. When overcurrent is detected, the second limiter 130 controls the limitation transistor 132 to connect the control terminal of the switching element 226 to the reference potential PGND earlier than the operational amplifier 122 starts limiting the control voltage OUT.

The limitation transistor 132 is a MOS transistor that has a sufficiently small gate capacitance and the like and is capable of operating at high speed. The limitation transistor 132 exhibits a lower current drawing capability than the sink-side transistor 114. Here, the expression "the current drawing capability" is defined as the maximum value of the currents that can be provided per unit time. In addition, the size of the limitation transistor 132 is smaller than the size of the sink-side transistor 114.

For example, the current drawing capability and size of the limitation transistor 132 may be equal to or less than 1/10, 1/100 or 1/1000 of the current drawing capability and size of the sink-side transistor 114. When overcurrent is detected, the driving circuit 100 uses the OR circuit 102 to force the source-side transistor 112 to be turned off When overcurrent is detected, the source current does not flow through the source-side transistor 112. Accordingly, sufficient charges can be drawn from the control terminal of the switching element 226 even if the current drawing capability of the limitation transistor 132 is relatively low. In addition, the limitation transistor 132 can be switched on and off at higher speed than the sink-side transistor 114. In other words, the limitation transistor 132, which is capable of operating at high speed, is additionally provided in addition to the sink-side transistor 114. In this manner, the driving circuit 100 can lower the control voltage OUT swiftly when overcurrent is detected without compromising the driving capability of the driving unit 110.

The AND circuit 138 controls the limitation transistor 132 based on the detection signal S. In the present example, the AND circuit 138 turns on the limitation transistor 132 when the control voltage OUT and the like satisfy predetermined conditions and the detection signal S indicates the H level. In the present example, the AND circuit 138 turns on the limitation transistor 132 when the control voltage OUT is higher than a second reference voltage and the detection signal S indicates the H level.

The second reference voltage is higher than the first reference voltage. Such a configuration can prevent the second limiter 130 from lowering the control voltage OUT after the first limiter 120 starts the limiting operation. As described above, the first reference voltage is higher than the threshold voltage of the switching element 226.

The first reference voltage may be higher than the threshold voltage of the switching element 226 by one volt or more, by two volts or more, or by four volts or more. The second reference voltage may be higher than the first reference voltage by one volt or more, by two volts or more, or by four volts or more. According to one working example, the voltage applied to the VCC terminal is 15 V, the second reference voltage is 12 V, the first reference voltage is 11 V and the threshold voltage of the switching element 226 is approximately 7 to 10 V.

In the present example, when overcurrent is detected, the second limiter 130 lowers the control voltage OUT to the second reference voltage, which is higher than the first reference voltage. The control voltage comparator 140 compares the control voltage OUT applied to the switching element 226 against the second reference voltage and outputs the result. In the present example, the control voltage comparator 140 compares the control voltage OUT divided by the resistances 134 and 136 against the voltage generated by the second reference power source 142. In the present example, the control voltage comparator 140 outputs the H level when the control voltage OUT is higher than the second reference voltage and outputs the L level when the control voltage OUT is equal to or lower than the second reference voltage.

The voltage generated by the second reference power source 142 is set based on the resistance ratio between the resistance 134 and the resistance 136 and on the second reference voltage, which is to be compared against the control voltage OUT.

The AND circuit 138 outputs a logical product between the output from the control voltage comparator 140 and the detection signal S. In this manner, the AND circuit 138 controls the limitation transistor 132 to connect the control terminal of the switching element 226 to the reference potential PGND when overcurrent is detected and the control voltage OUT is higher than the second reference voltage. With such a configuration, the driving circuit 100 can appropriately limit the control voltage OUT of the switching element 226 swiftly and without causing oscillation and the like.

FIG. 2 shows the structure of the driving circuit 100 designed to drive the lower switching element 226. The driving circuit 100 designed to drive the upper switching element 224 may have the same structure.

Figure 3:
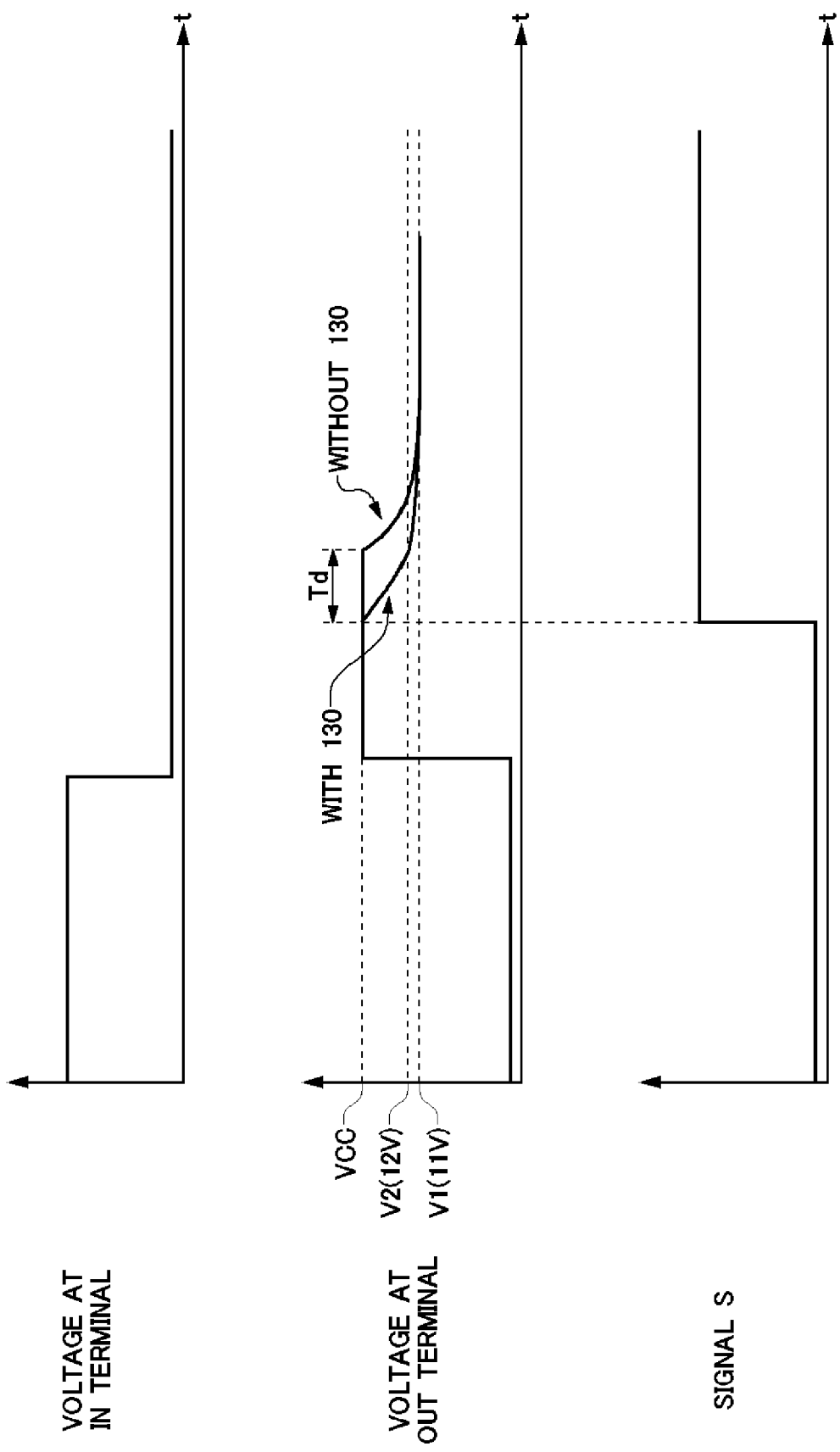
FIG. 3 is a timing chart showing, as an example, how the driving circuit 100 operates when overcurrent is detected.

FIG. 3 is a timing chart showing, as an example, how the driving circuit 100 operates when overcurrent is detected. FIG. 3 compares how the driving circuit 100 operates differently with and without the second limiter 130. In FIG. 3, the horizontal axis represents the time t and the vertical axis represents the voltage value. Once the signal input into the IN terminal transitions to the L level, the voltage at the OUT terminal (i.e., the control voltage of the switching element 226) rises to the voltage equal to the voltage at the VCC terminal. In the present example, the voltage at the VCC terminal is 15 V.

If overcurrent is detected at this stage and a detection signal S indicating the H level is output, the first limiter 120 transitions to the operational state. As described above, the first limiter 120 has a delay Td until it starts the voltage limiting operation. Therefore, if the driving circuit 100 does not include the second limiter 130, the control voltage OUT of the switching element 226 remains at the VCC level until the delay time Td elapses after overcurrent is detected.

Once the delay time Td has elapsed, the first limiter 120 starts operating and the control voltage OUT of the switching element 226 is thus controlled to be equal to the first reference voltage V1. Here, the phrase "the first limiter 120 starts operating" means that the operational amplifier 122 starts outputting the voltage according to the difference between the control voltage OUT divided by the resistances 124 and 126 and the first reference voltage.

On the other hand, if the driving circuit 100 includes the second limiter 130, the second limiter 130 starts lowering the control voltage OUT earlier than the first limiter 120 does. Specifically speaking, the second limiter 130 keeps the limitation transistor 132 turned on to connect the OUT terminal to the reference potential PGND until the control voltage OUT reaches the level equal to or lower than the second reference voltage.

The time required to complete the transition of the limitation transistor 132 from the OFF state to the ON state is sufficiently shorter than the delay Td of the first limiter 120. Therefore, the control voltage OUT of the switching element 226 starts falling earlier than when the second limiter 130 is not included. The change in the control voltage per unit time may be larger when the second limiter 130 lowers the control voltage than when the first limiter 120 lowers the control voltage.

The second limiter 130 turns off the limitation transistor 132 when the control voltage OUT becomes equal to or lower than the second reference voltage V2. The second reference voltage V2 may be set in such a manner that the timing at which the control voltage OUT becomes equal to or lower than the second reference voltage V2 is substantially concurrent with the timing at which the first limiter 120 starts operating. Alternatively, the second reference voltage V2 may be set in such a manner that the control voltage OUT becomes equal to or lower than the second reference voltage V2 before the first limiter 120 starts operating. In this case, the second limiter 130 keeps the control voltage OUT to remain at the voltage near the second reference voltage V2 until the first limiter 120 starts operating.

The first limiter 120 starts operating once the delay time Td has elapsed after overcurrent is detected. As described above, the first limiter 120 controls the control voltage OUT to reach the level equal to the first reference voltage V1. As described above, the first reference voltage V1 is lower than the second reference voltage V2.

The difference between the first reference voltage V1 and the second reference voltage V2 is determined in such a manner that, once the first limiter 120 has started operating, the limitation transistor 132 of the second limiter 130 is prevented from being turned on. It is, however, preferable that the second reference voltage V2 is as low as possible in order to allow the second limiter 130 to sufficiently lower the control voltage OUT.

The first reference voltage V1 is determined at such a level that the switching element 226 can be kept turned on and that the collector current of the switching element 226 can be sufficiently limited. The second reference voltage V2 is preferably set at such a level that the second reference voltage V2 is higher than the first reference voltage V1 and as low as possible provided that the first limiter 120 and the second limiter 130 do not concurrently operate. The second reference voltage V2 may be set relatively high and the limitation transistor 132 may be thus turned off before the first limiter 120 starts operating. Even in this case, no problems occur as long as the time between when the limitation transistor 132 is turned off and when the first limiter 120 starts operating is sufficiently shorter than the delay Td.

Figure 4:
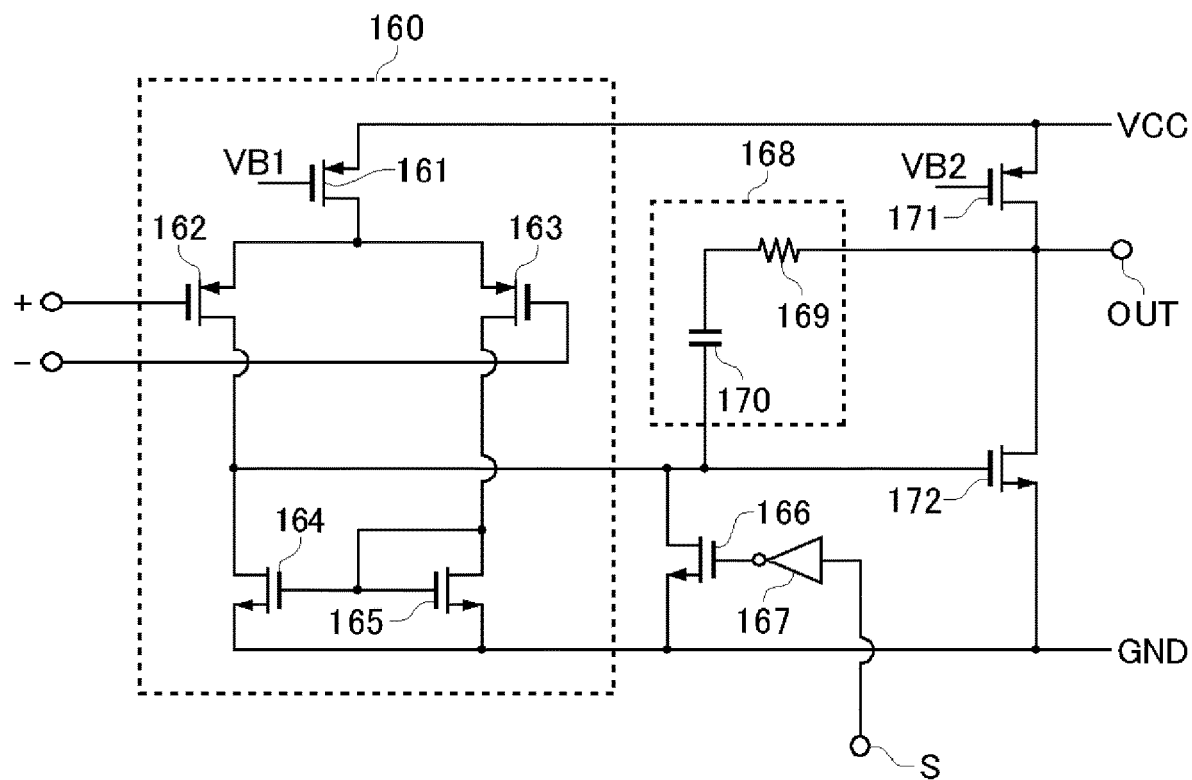
FIG. 4 is a circuit diagram showing an example of an operational amplifier 122.

FIG. 4 is a circuit diagram showing an example of the operational amplifier 122. In the present example, the operational amplifier 122 includes a differential circuit 160, a time constant circuit 168, a state control transistor 166, an inverter 167, a transistor 171 and an output transistor 172.

The differential circuit 160 outputs a voltage according to the difference between the first reference voltage that is input through the positive terminal and the control voltage that is input through the negative terminal. In the present example, the differential circuit 160 includes MOS transistors 161, 162, 163, 164 and 165.

The transistor 161 is positioned between the VCC potential and the GND potential and serves as a current source to provide a current according to the voltage VB1 input into the gate terminal. The transistor 161 defines the currents flowing through the differential pair of the differential circuit 160.

The transistor 162 is positioned between the transistor 161 and the GND potential and the first reference voltage (in the example of FIG. 2, the voltage of the first reference power source 128) is applied to the gate terminal of the transistor 162. The transistor 163 is positioned between the transistor 161 and the GND potential and the control voltage (in the example of FIG. 2, the control voltage divided by the resistances 124 and 126 is applied to the gate terminal of the transistor 163. The transistors 162 and 163 operate as the differential pair of the differential circuit 160.

The transistor 164 is positioned between the transistor 162 an the GND potential. The transistor 165 is positioned between the transistor 163 and the GND potential. The gate terminals of the transistors 164 and 165 are connected to each other and to the drain terminal of the transistor 165. The voltage at the connection point between the transistor 162 and the transistor 164 is treated as the output voltage of the differential circuit 160.

The transistor 171 is positioned between the VCC potential and the GND potential and serves as a current source to provide a current according to the voltage VB2 input into the gate terminal thereof. The output transistor 172 is positioned between the transistor 171 and the GND potential, and the output voltage from the differential circuit 160 is applied to the gate terminal of the output transistor 172. The voltage at the connection point between the transistor 171 and the output transistor 172 is treated as the output voltage from the operational amplifier 122.

The transistor 171 and the output transistor 172 each serve as a source ground amplifier circuit. To be specific, the output transistor 172 amplifies the voltage applied to the gate terminal thereof with a predetermined amplification factor and outputs the resulting voltage.

The time constant circuit 168 is positioned between the output end of the differential circuit 160 and the output end of the operational amplifier 122. In the present example, the time constant circuit 168 is connected between the gate terminal and the drain terminal of the output transistor 172. The time constant circuit 168 is, for example, an RC circuit including a resistance 169 and a capacitor 170 that are connected in series. The time constant circuit 168 may not include the resistance 169. The time constant circuit 168 regulates the frequency characteristics of the operational amplifier 122 in order to prevent, for example, the control voltage from oscillating. The time constant circuit 168 may set the frequency characteristics of the operational amplifier 122 in such a manner that the gain in the high-frequency range is small.

The state control transistor 166 connects the gate terminal of the output transistor 172 to the GND potential when the detection signal S indicates the L level (i.e., when no overcurrent is detected). As a result, the GND potential is input into the source grounded amplifier that is provided at the output stage of the operational amplifier 122. Thus, the operational amplifier 122 enters the non-operational state. The state control transistor 166 disconnects the gate terminal of the output transistor 172 from the GND potential when the detection signal S indicates the H level (i.e., when overcurrent is detected).

As a result, the output signal from the differential circuit 160 is input into the gate terminal of the output transistor 172. Thus, the operational amplifier 122 enters the operational state. It should be noted, however, that the time constant circuit 168 causes the delay Td before the operational amplifier 122 starts the voltage limiting operation. The delay Td is substantially equal to the time constant of the operational amplifier 122. In the present example, Td=RC [sec].

The inverter 167 inverts the logic value of the detection signal S and applies the result to the gate terminal of the state control transistor 166. In the present example, the state control transistor 166 is an N-channel MOS transistor. In this manner, the state control transistor 166 operates in the above-described manner.

Figure 5:
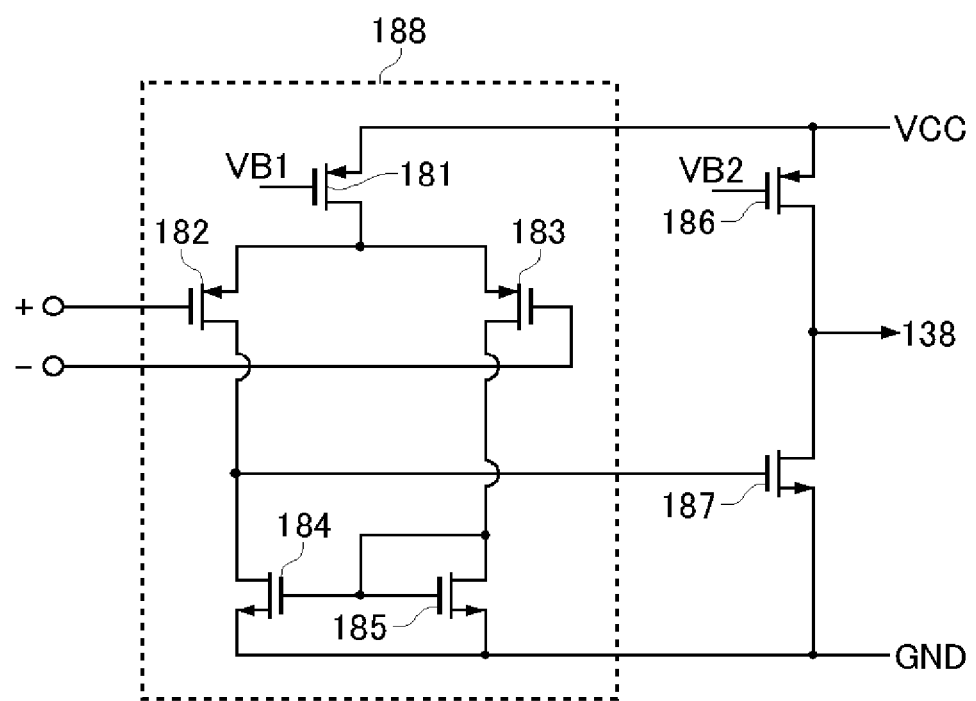
FIG. 5 is a circuit diagram showing an example of a control voltage comparator 140.

FIG. 5 is a circuit diagram showing an example of the control voltage comparator 140. In the present example, the control voltage comparator 140 includes a differential circuit 188, a transistor 186 and an output transistor 187. The differential circuit 188 has the same structure as the differential circuit 160 shown in FIG. 4. Note that, however, the differential circuit 188 outputs a voltage according to the difference between the control voltage input through the positive terminal and the second reference voltage input through the negative terminal.

In the present example, the differential circuit 188 includes MOS transistors 181, 182, 183, 184 and 185. The MOS transistors 181 to 185 have the same structure as the MOS transistors 161 to 165 shown in FIG. 4. The differential circuit 188 switches whether the output transistor 187 is turned on or off depending on whether the control voltage is higher than the second reference voltage.

The transistor 186 is positioned between the VCC potential and the GND potential and serves as a current source to provide a current according to the voltage VB2 input into the gate terminal of the transistor 186. The output transistor 187 is positioned between the transistor 186 and the GND potential, and the output voltage from the differential circuit 188 is applied to the gate terminal of the output transistor 187.

The voltage at the connection point between the transistor 186 and the output transistor 187 is treated as the output voltage from the control voltage comparator 140. The control voltage comparator 140 outputs the voltage indicating the H level when the control voltage is higher than the second reference voltage and outputs the voltage indicating the L level when the control voltage is equal to or lower than the second reference voltage.

As shown in FIG. 5, the control voltage comparator 140 does not include the time constant circuit 168. For this reason, the control voltage comparator 140 can output the result of the comparison between the control voltage and the second reference voltage earlier than the operational amplifier 122 starts the voltage limiting operation. In addition, the delay time from when the logic input into the AND circuit 138 transitions to when the output from the AND circuit 138 transitions is sufficiently shorter than the delay time Td of the first limiter 120. Therefore, the limitation transistor 132 can be controlled swiftly.

Figure 6:
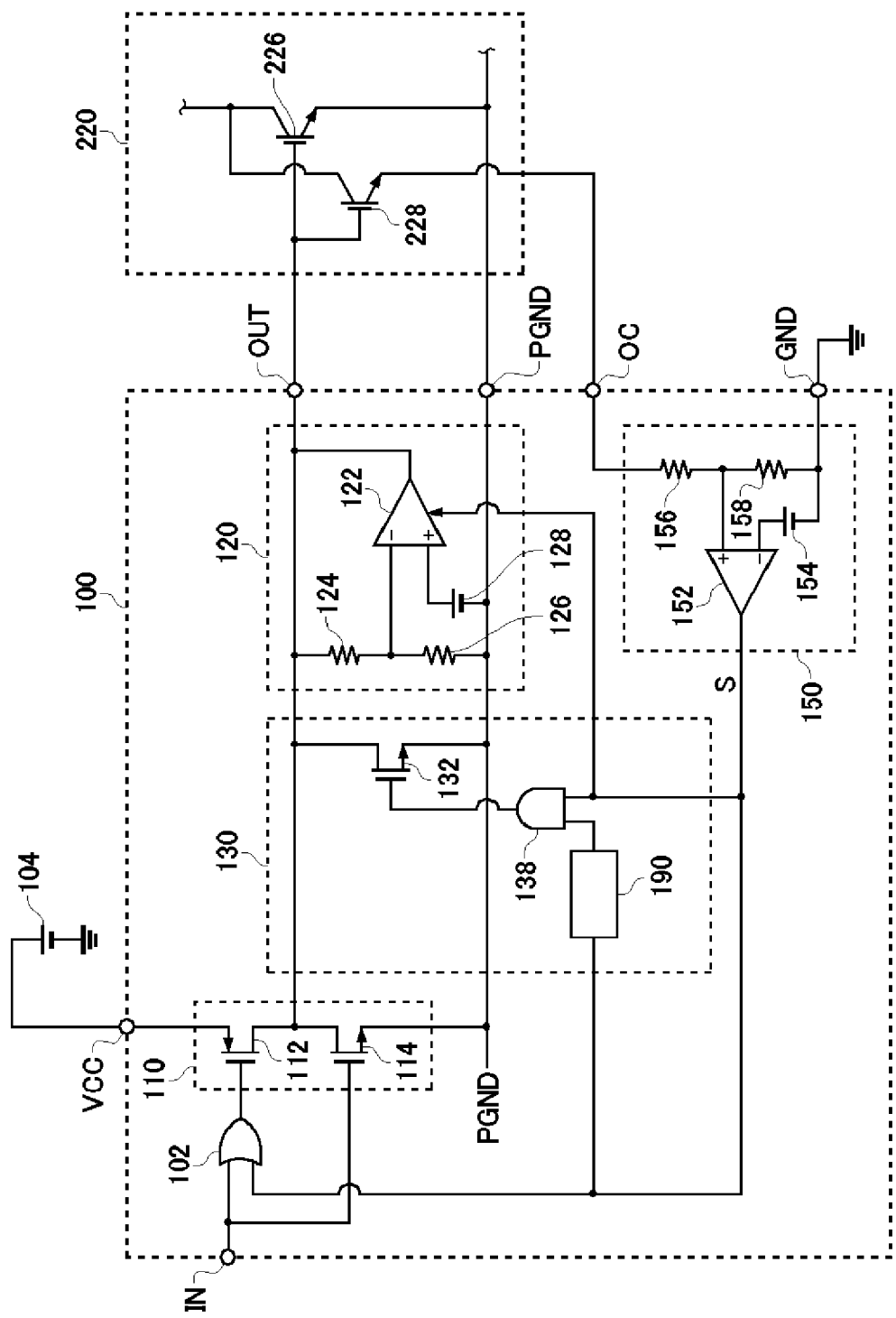
FIG. 6 is a circuit diagram showing a modification example of the driving circuit 100 relating to the first embodiment, together with the semiconductor circuit 220.

FIG. 6 is a circuit diagram showing a modification example of the driving circuit 100 relating to the first embodiment, together with the semiconductor circuit 220. In the present example, the driving circuit 100 is different from the driving circuit 100 shown in FIG. 2 in terms of the structure of the second limiter 130. Except for this, the driving circuit of the present modification example is the same as the driving circuit 100 shown in FIG. 2.

The second limiter 130 of the present example includes a limitation transistor 132, an AND circuit 138 and a time controller 190. The limitation transistor 132 and the AND circuit 138 are the same as the limitation transistor 132 and the AND circuit 138 shown in FIG. 2. Note that, however, the AND circuit 138 of the present example outputs a logical product between the output from the time controller 190 and the detection signal S.

The time controller 190 continues outputting a signal designed to keep the limitation transistor 132 turned on until a predetermined maintaining period elapses after the detection signal S transitions to the H level. In the present example, the time controller 190 continues outputting a signal indicating the H level until the maintaining period elapses after the detection signal S transitions to the H level. This maintaining period may have substantially the same duration as the time period required to cause the control voltage to reach the second reference voltage. The maintaining period may be set so as to have substantially the same duration as the delay time Td of the first limiter 120.

Figure 7:
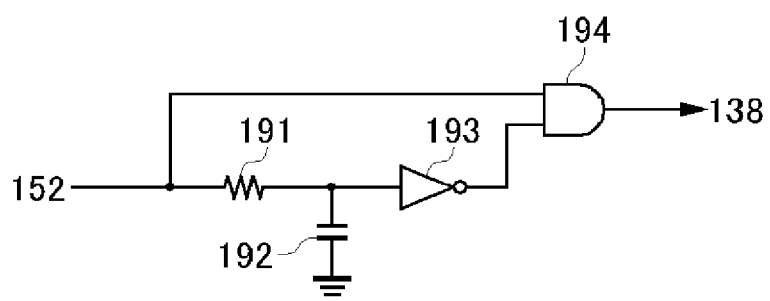
FIG. 7 is a circuit diagram showing an example of a time controller 190.

FIG. 7 is a circuit diagram showing an example of the time controller 190. In the present example, the time controller 190 includes a resistance 191, a capacitor 192, an inverter 193 and a logical product circuit 194. The logical product circuit 194 outputs a logical product between the detection signal S output from the current comparator 152 and the output from the inverter 193.

The signal input into the inverter 193 transitions to the H level when the predetermined maintaining period has elapsed after the detection signal S transitions to the H level. In the present example, the resistance 191 is positioned between the input terminal of the inverter 193 and the current comparator 152. The capacitor 192 is positioned between the input terminal of the inverter 193 and the ground potential. The resistance 191 and the capacitor 192 remove the high-frequency components of the detection signal S and input the result into the inverter 193.

In other words, the resistance 191 and the capacitor 192 control the detection signal S to rise less sharply and input the resulting detection signal S into the logical product circuit 194. If the detection signal S rises less sharply, the detection signal S exceeds a threshold value and transitions to the H level at a delayed timing. Accordingly, the signal input into the inverter 193 is obtained by delaying the detection signal S by a predetermined time. The characteristic values of the resistance 191 and the capacitor 192 are set in such a manner that this predetermined delay time is substantially equal to the delay time Td of the first limiter 120.

The inverter 193 inverts the input signal and outputs the inverted signal. Therefore, the logical product circuit 194 continues outputting a signal indicating the H level for a predetermined maintaining period of time after the detection signal S transitions to the H level. Here, the logical product circuit 194 and the AND circuit 138 may be implemented by a common circuit. To be specific, the logical product circuit 194 is omitted, and the output of the inverter 193 and the output of the current comparator 152 may be connected to the input of the AND circuit 138.

With the structures shown in FIGS. 6 and 7, the second limiter 130 can also lower the control voltage swiftly when overcurrent is detected. In addition, the first limiter 120 can control the control voltage to be equal to the first reference voltage without causing oscillation and the like.

Figure 8:
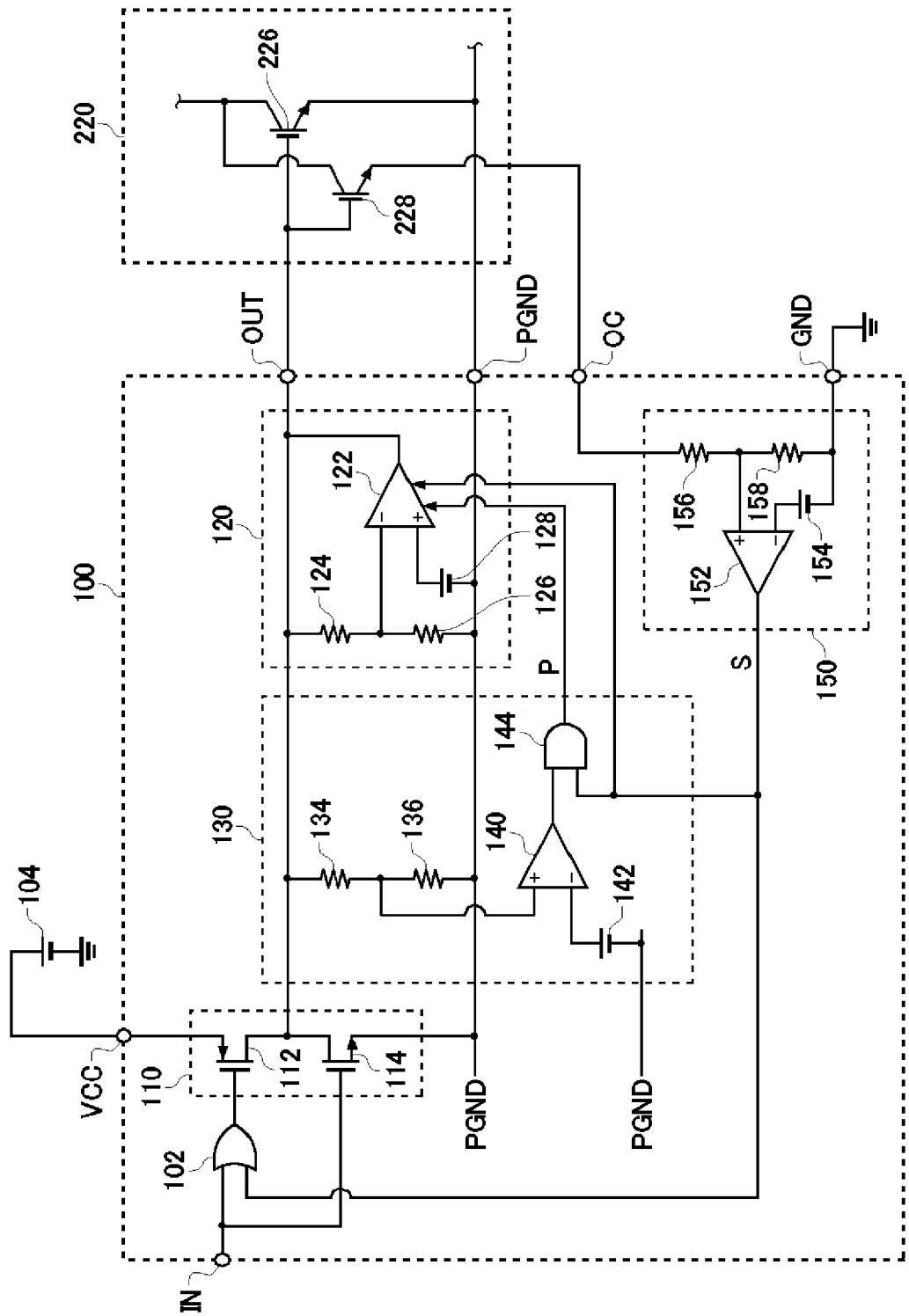
FIG. 8 is a circuit diagram showing a driving circuit 100 relating to a second embodiment.

FIG. 8 is a circuit diagram showing a driving circuit 100 relating to a second embodiment. The driving circuit 100 relating to the second embodiment is different from the driving circuit 100 relating to the first embodiment in terms of the structures of the first limiter 120 and the second limiter 130. Except for this, the driving circuit 100 relating to the second embodiment is the same as the driving circuit 100 relating to the first embodiment.

According to the present example, the second limiter 130 keeps the time constant of the first limiter 120 reduced until the control voltage reaches the second reference voltage, when overcurrent is detected. In the present example, the second limiter 130 keeps the time constant of the operational amplifier 122 reduced until the control voltage reaches the second reference voltage, when overcurrent is detected.

In the present example, the second limiter 130 does not include the limitation transistor 132. Furthermore, the second limiter 130 includes an AND circuit 144 in place of the AND circuit 138. Except for these features, the second limiter 130 relating to the second embodiment has the same structure as the second limiter 130 relating to the first embodiment.

The AND circuit 144 controls the time constant of the operational amplifier 122 based on the logical product P between the detection signal S and the output from the control voltage comparator 140. To be specific, the AND circuit 144 reduces the time constant of the operational amplifier 122 if the detection signal S indicates the H level and the control voltage is higher than the second reference voltage, when compared with the time constant under the normal circumstances where no overcurrent is detected. The AND circuit 144 is an exemplary control circuit designed to reduce the time constant of the operational amplifier 122.

With such a configuration, the second limiter 130 can allow the first limiter 120 to start lowering the control voltage earlier than the normal operation start timing of the first limiter 120, when overcurrent is detected. The normal operation start timing of the first limiter 120 indicates the operation start timing determined by the time constant of the first limiter 120 that is not controlled by the second limiter 130. For example, the normal operation start timing of the first limiter 120 indicates, as shown in FIG. 3, the timing at which the delay Td has elapsed after overcurrent is detected.

Figure 9:
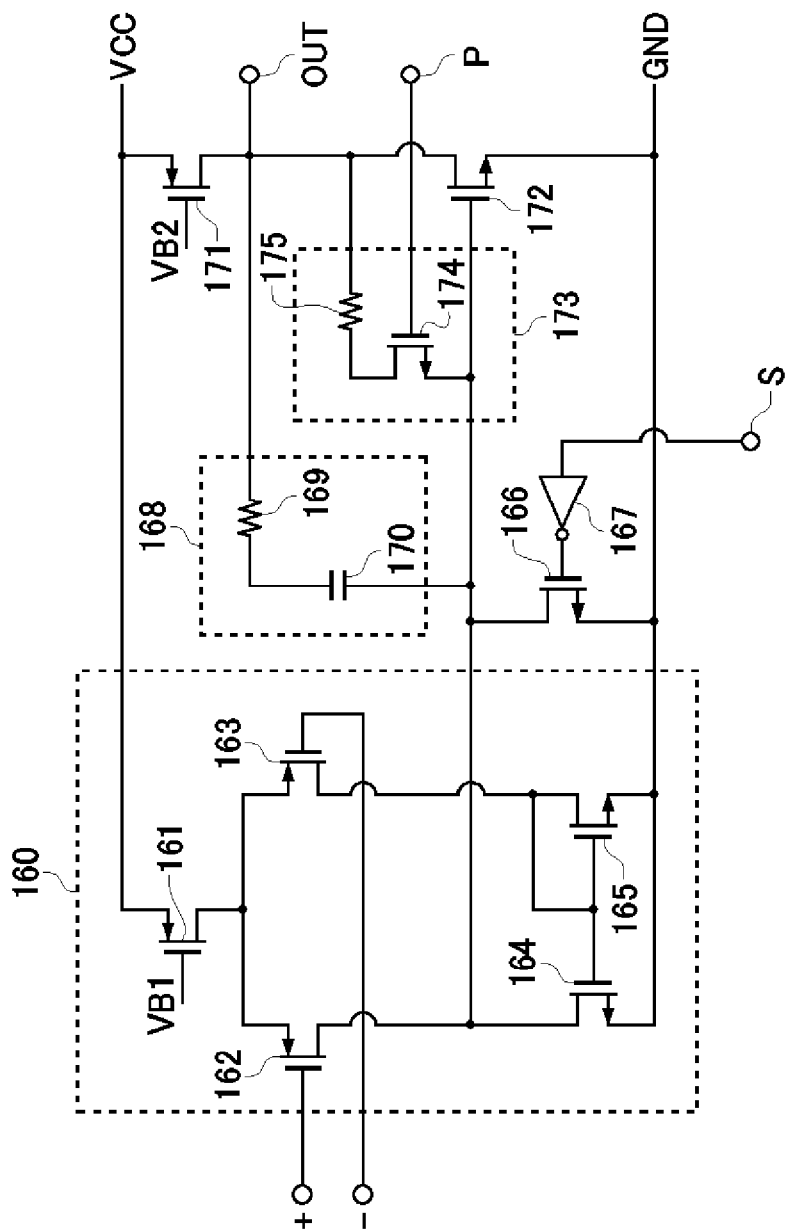
FIG. 9 is a circuit diagram showing an example of an operational amplifier 122.

FIG. 9 is a circuit diagram showing an example of the operational amplifier 122. In the present example, the operational amplifier 122 further includes a short switching unit 173 in addition to the constituents of the operational amplifier 122 shown in FIG. 4. Except for these, the operational amplifier 122 shown in FIG. 9 is the same as the operational amplifier 122 shown in FIG. 4.

The operational amplifier 122 operates according to the time constant of the time constant circuit 168 that is positioned between the output end of the differential circuit 160 and the output end of the operational amplifier 122. The operational amplifier 122 regulates the control voltage according to the result of its operation. The short switching unit 173 switches whether the ends of the time constant circuit 168 are shorted with a path having a smaller time constant than the time constant circuit 168. Stated differently, the short switching unit 173 switches whether or not to deactivate the time constant circuit 168 designed to regulate the phase of the operational amplifier 122 and to resultantly cause the operational amplifier 122 to serve as a comparator having a small time constant.

In the present example, the short switching unit 173 includes a switch transistor 174 and a resistance 175. The resistance 175 is a resistance on the path that shorts the ends of the time constant circuit 168. The switch transistor 174 switches whether to short the ends of the time constant circuit 168 with the path having the resistance 175.

In the present example, the switch transistor 174 is an N-channel MOS transistor. The gate terminal of the switch transistor 174 is applied with the voltage output from the AND circuit 144 shown in FIG. 8. Accordingly, when the AND circuit 144 outputs the H level, the switch transistor 174 is turned on. In this case, the ends of the time constant circuit 168 are shorted with the path having a smaller time constant than the time constant circuit 168. In this manner, the time constant of the operational amplifier 122 is reduced.

The above-described normal operation start timing of the first limiter 120 is defined as the operation start timing of the first limiter 120 that can be observed if the switch transistor 174 is kept turned off. In other words, the normal operation start timing of the first limiter 120 is the operation start timing determined by the delay Td that is determined by the time constant of the time constant circuit 168.

The AND circuit 144 instructs the short switching unit 173 to short the ends of the time constant circuit 168 when overcurrent is detected and the control voltage is higher than the second reference voltage. Accordingly, the AND circuit 144 turns off the switch transistor 174 of the short switching unit 173 when the control voltage becomes equal to or lower than the second reference voltage. As a result, the operational amplifier 122 operates with the time constant of the time constant circuit 168.

In other words, when overcurrent is detected, the second limiter 130 sets a smaller time constant at the operational amplifier 122 than under the normal circumstances if the control voltage is higher than the second reference voltage. In this way, the operational amplifier 122 can operate at high speed. Therefore, the control voltage starts falling before the delay time Td shown in FIG. 3 elapses.

Once the control voltage becomes equal to or lower than the second reference voltage, the second limiter 130 restores a normal time constant at the operational amplifier 122. In this way, the driving circuit 100 can accurately control the control voltage without causing oscillation and the like.

Figure 10:
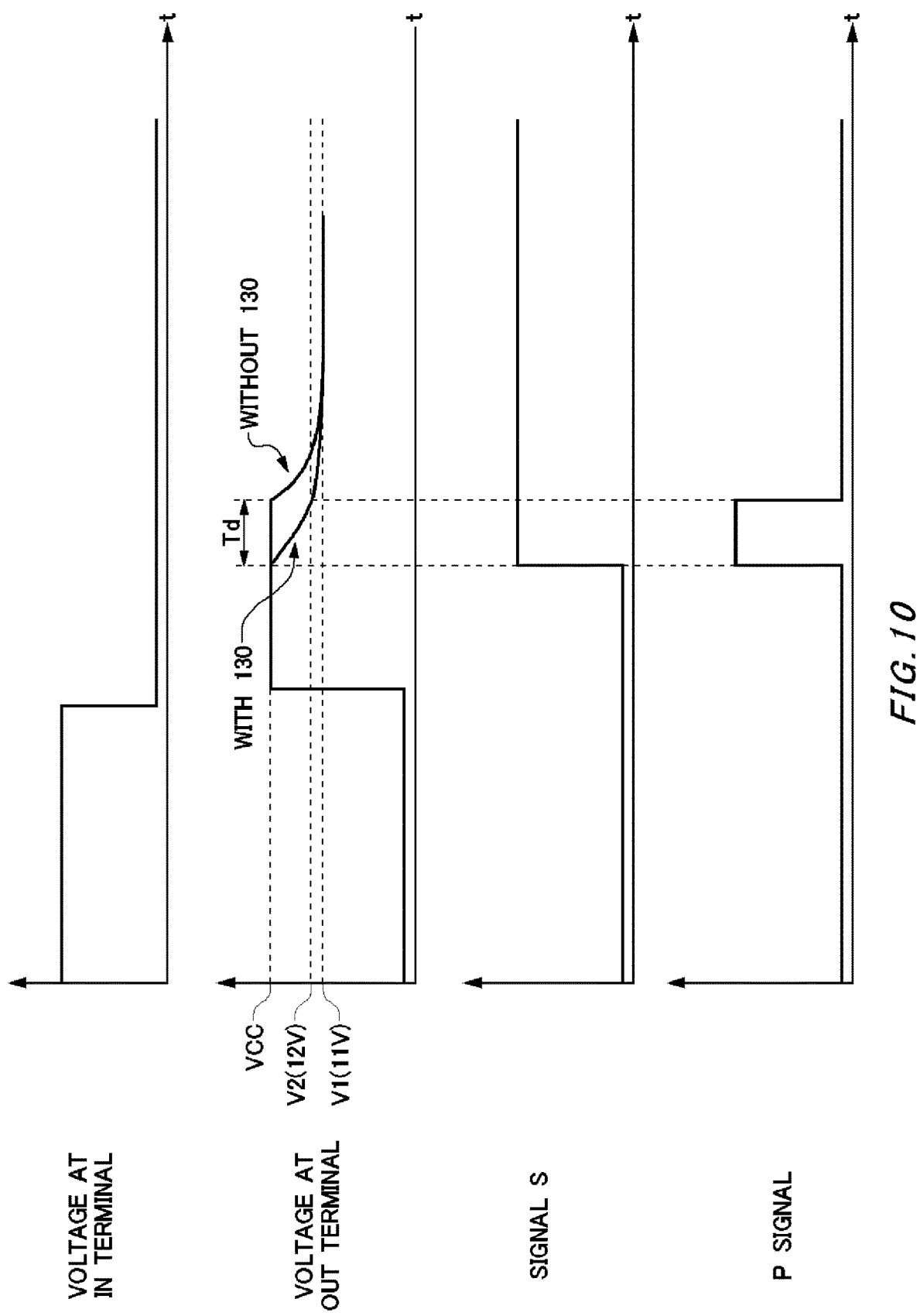
FIG. 10 is a timing chart showing, as an example, how the driving circuit 100 operates when overcurrent is detected.

FIG. 10 is a timing chart showing, as an example, how the driving circuit 100 relating to the second embodiment operates when overcurrent is detected. FIG. 10 also compares how the driving circuit 100 operates differently with and without the second limiter 130. In FIG. 10, the horizontal axis represents the time t and the vertical axis represents the voltage value.

The signal input into the IN terminal, the control voltage OUT output from the OUT terminal, and the waveform of the detection signal S are the same as the corresponding signals of the example shown in FIG. 3. FIG. 10 shows the waveform of the P signal output from the AND circuit 144, in addition to the above-mentioned signals.

The AND circuit 144 continues outputting a P signal indicating the H level until the control voltage OUT becomes equal to or lower than the second reference voltage V2 after the detection signal S transitions to the H level. While the P signal indicates the H level, the time constant of the operational amplifier 122 is small. Therefore, the control voltage OUT starts falling swiftly before the delay time Td elapses. Once the control voltage OUT becomes equal to or lower than the second reference voltage V2, the AND circuit 144 outputs a P signal indicating the L level. As a result, the normal time constant is restored at the operational amplifier 122. With the above-described configuration, the control voltage OUT slowly approaches the first reference voltage V1.

Figure 11:
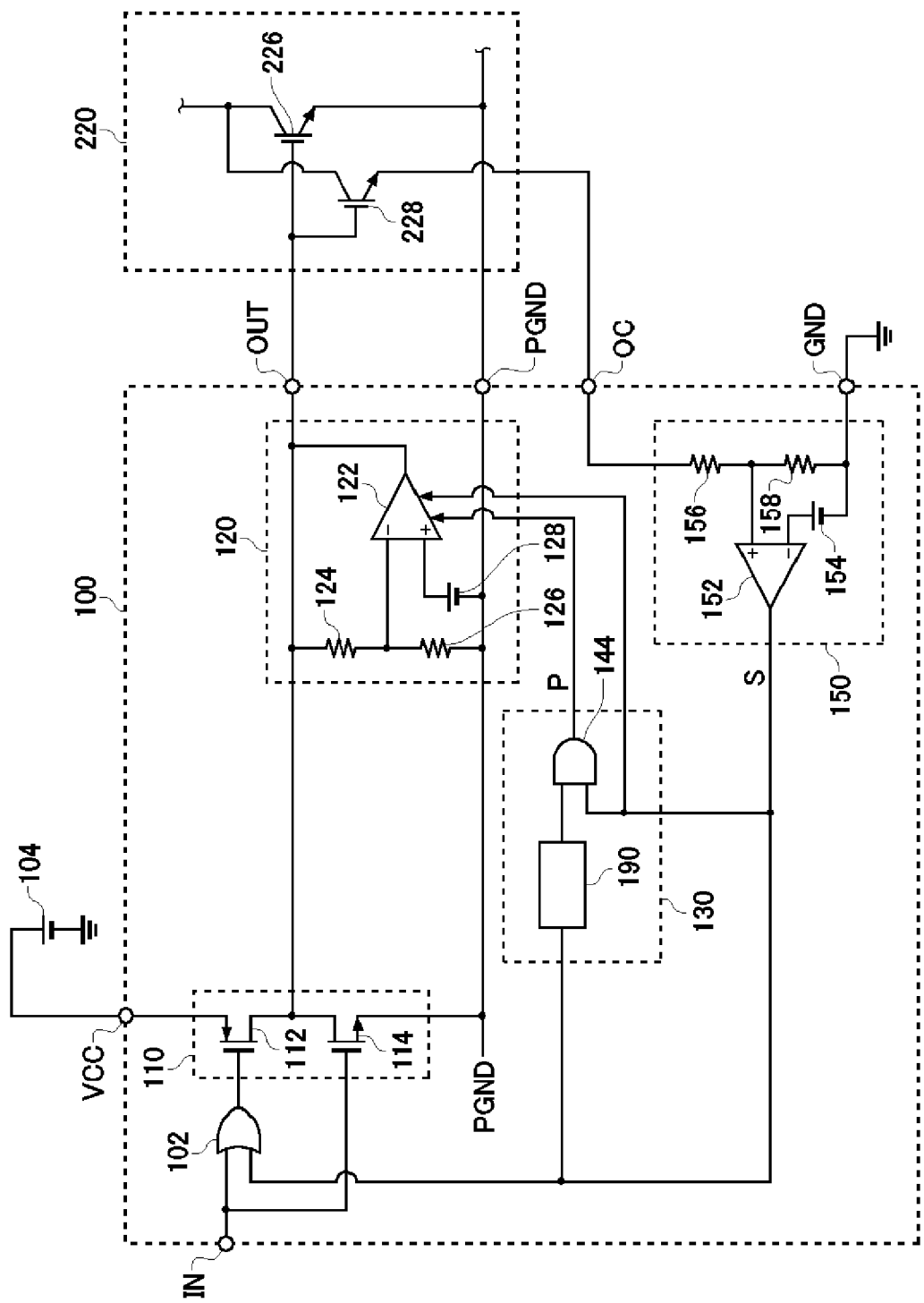
FIG. 11 is a circuit diagram showing a modification example of the driving circuit 100 relating to the second embodiment, together with the semiconductor circuit 220.

FIG. 11 is a circuit diagram showing a modification example of the driving circuit 100 relating to the second embodiment, together with the semiconductor circuit 220. In the present example, the driving circuit 100 is different from the driving circuit 100 shown in FIG. 10 in terms of the structure of the second limiter 130. Except for this, the driving circuit 100 of the present example is the same as the driving circuit 100 shown in FIG. 10. The second limiter 130 relating to the present example is the same as the second limiter 130 shown in FIGS. 6 and 7.

To be specific, the second limiter 130 of the present example keeps the time constant of the operational amplifier 122 smaller than the normal time constant until a predetermined maintaining period elapses after the detection signal S transitions to the H level. The second limiter 130 controls the short switching unit 173 of the operational amplifier 122. According to the above-described configuration, the control voltage can be also lowered swiftly when overcurrent is detected and, at the same time, the control voltage can be accurately controlled without causing oscillation and the like.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

DECRIPTION OF REFERENCE NUMERALS

100 . . . driving circuit, 102 . . . OR circuit, 104 . . . DC power source, 110 . . . driving unit, 112 . . . source-side transistor, 114 . . . sink-side transistor, 120 . . . first limiter, 122 . . . operational amplifier, 124, 126 . . . resistance, 128 . . . first reference power source, 130 . . . second limiter, 132 . . . limitation transistor, 134, 136 . . . resistance, 138 . . . AND circuit, 140 . . . control voltage comparator, 142 . . . second reference power source, 144 . . . AND circuit, 150 . . . overcurrent detector, 152 . . . current comparator, 154 . . . threshold power source. 156, 158 . . . resistance, 160 . . . differential circuit, 161, 162, 163, 164, 165 . . . transistor, 166 . . . state control transistor, 167 . . . inverter, 168 . . . time constant circuit, 169 . . . resistance, 170 . . . capacitor, 171 . . . transistor, 172 . . . output transistor, 173 . . . short switching unit, 174 . . . switch transistor, 175 . . . resistance, 181, 182, 183, 184, 185, 186 . . . transistor, 187 . . . output transistor, 188 . . . differential circuit, 190 . . . time controller, 191 . . . resistance, 192 . . . capacitor, 193 . . . inverter, 194 . . . logical product circuit, 200 . . . semiconductor module, 210 . . . system controller, 220 . . . semiconductor circuit, 222 . . . switching arm, 224, 226 . . . switching element, 228 . . . current detector element, 300 . . . system

What is claimed is:

1. A driving circuit for driving a switching element in accordance with an input signal, the driving circuit comprising:
   a driving unit connected to a control terminal of the switching element, the driving unit configured to switch, in accordance with the input signal, which one of a source current and a sink current is to be fed to the control terminal of the switching element;
   a first limiter configured to operate with a predetermined time constant and to limit a control voltage at the control terminal of the switching element to a first reference voltage when overcurrent is detected for a collector current of the switching element; and
   a second limiter configured to, when the overcurrent is detected, start lowering the control voltage earlier than an operation start timing of the first limiter that is determined by the time constant, wherein
   the first reference voltage is higher than a threshold voltage of the switching element, and
   the second limiter lowers the control voltage to a second reference voltage that is higher than the first reference voltage, when the overcurrent is detected.

2. The driving circuit as set forth in claim 1, wherein
   the second limiter includes a limitation transistor configured to switch whether to connect the control terminal of the switching element to a reference potential, and
   when the overcurrent is detected, the limitation transistor connects the control terminal of the switching element to the reference potential before the first limiter starts limiting the control voltage.

3. The driving circuit as set forth in claim 2, wherein
   the first limiter includes an operational amplifier that is configured to operate with the time constant, has an output terminal connected to the control terminal of the switching element and is configured to regulate the control voltage based on a difference between the control voltage and the first reference voltage, and
   when the overcurrent is detected, the second limiter controls the limitation transistor to connect the control terminal of the switching element to the reference potential before the operational amplifier starts limiting the control voltage.

4. The driving circuit as set forth in claim 3, wherein
   the second limiter includes:
   a control voltage comparator configured to compare the control voltage and the second reference voltage and output a result of the comparison; and
   a control circuit configured to control the limitation transistor to connect the control terminal of the switching element to the reference potential when the overcurrent is detected and the control voltage is higher than the second reference voltage.

5. The driving circuit as set forth in claim 3, wherein
   the second limiter includes
   a control circuit configured to control the limitation transistor to connect the control terminal of the switching element to the reference potential until a predetermined period elapses after the overcurrent is detected.

6. The driving circuit as set forth in claim 2, wherein
   the driving unit includes a sink-side transistor configured to draw the sink current from the control terminal of the switching element, and
   the limitation transistor has a lower current drawing capability than the sink-side transistor.

7. The driving circuit as set forth in claim 1, wherein
   when the overcurrent is detected, the second limiter keeps the time constant of the first limiter reduced until the control voltage reaches the second reference voltage.

8. The driving circuit as set forth in claim 7, wherein
   the first limiter includes an operational amplifier that is configured to operate with the time constant, has an output terminal connected to the control terminal of the switching element and is configured to regulate the control voltage based on a difference between the control voltage and the first reference voltage, and
   the second limiter includes:
   a control voltage comparator configured to compare the control voltage and the second reference voltage and outputs a result of the comparison; and
   a control circuit configured to reduce the time constant of the operational amplifier when the overcurrent is detected and the control voltage is higher than the second reference voltage.

9. The driving circuit as set forth in claim 7, wherein
   the first limiter includes an operational amplifier that is configured to operate with the time constant, has an output terminal connected to the control terminal of the switching element and is configured to regulate the control voltage based on a difference between the control voltage and the first reference voltage, and
   the second limiter includes a control circuit configured to keep the time constant of the operational amplifier reduced until a predetermined period elapses after the overcurrent is detected.

10. The driving circuit as set forth in claim 8, wherein
    the operational amplifier includes:
    a differential circuit configured to operate according to a difference between the control voltage and the first reference voltage;
    a time constant circuit positioned between an output end of the differential circuit and an output end of the operational amplifier; and
    a short switching unit configured to switch whether to short ends of the time constant circuit, and
    the control circuit instructs the short switching unit to short the ends of the time constant circuit when the overcurrent is detected and the control voltage is higher than the second reference voltage.

11. The driving circuit as set forth in claim 3, wherein
    the operational amplifier transitions from a non-operational state to an operational state when the overcurrent is detected.

12. The driving circuit as set forth in claim 1, wherein
    the driving unit includes a source-side transistor configured to feed the source current to the control terminal of the switching element, and
    the driving circuit further comprises a circuit configured to turn off the source-side transistor when the overcurrent is detected.

13. A semiconductor module comprising:
    the driving circuit as set forth in claim 1; and
    a semiconductor circuit including the switching element.

* * * * *